(12) United States Patent
Arora et al.

(10) Patent No.: US 9,865,362 B1
(45) Date of Patent: Jan. 9, 2018

(54) METHOD AND APPARATUS FOR TESTING ERROR CORRECTION CODE (ECC) LOGIC AND PHYSICAL MEMORY ONBOARD A MANUFACTURED INTEGRATED CIRCUIT (IC)

(71) Applicant: Cadence Design Systems, Inc., San Jose, CA (US)

(72) Inventors: Puneet Arora, Uttar Pradesh (IN); Steven Lee Gregor, Owego, NY (US); Norman Robert Card, Vestal, NY (US); Navneet Kaushik, Delhi (IN)

(73) Assignee: Cadence Design Systems, Inc., San Jose, CA (US)

( * ) Notice: Subject to any disclaimer, the term of this patent is extended or adjusted under 35 U.S.C. 154(b) by 34 days.

(21) Appl. No.: 15/019,504

(22) Filed: Feb. 9, 2016

(51) Int. Cl.
G11C 29/00 (2006.01)
G11C 29/42 (2006.01)
G11C 29/44 (2006.01)

(52) U.S. Cl.
CPC .............. *G11C 29/42* (2013.01); *G11C 29/44* (2013.01)

(58) Field of Classification Search
CPC ................................. G11C 29/42; G11C 29/44
See application file for complete search history.

(56) References Cited

U.S. PATENT DOCUMENTS

| | | | | |
|---|---|---|---|---|
| 2007/0255981 A1* | 11/2007 | Eto | ...................... | G06F 11/1008 714/710 |
| 2014/0143619 A1* | 5/2014 | Gorman | .................. | G11C 29/36 714/719 |
| 2016/0019981 A1* | 1/2016 | Gorman | .................. | G11C 29/36 714/719 |
| 2016/0268007 A1* | 9/2016 | Jones | ...................... | G11C 29/42 |

* cited by examiner

*Primary Examiner* — Thien D Nguyen
(74) *Attorney, Agent, or Firm* — Andrews Kurth Kenyon LLP

(57) ABSTRACT

Method and apparatus for testing the memory components of an integrated Circuit (IC) using a routing logic and a built-in design for test (DFT) hardware processing device. Based on input provided from an interface controller to the IC, the IC is tested according to one of at least two modes. In a first mode, the built-in DFT hardware processing device executes a test that checks for faults in the physical memory of the IC. In a second mode, the built-in DFT hardware processing device executes a test that checks for faults in the error correction logic of the IC. By using the same routing logic and built-in DFT hardware processing device, tests of the memory components according to the first and second mode can be executed on an automatic and serial basis, even after the manufacture of the IC.

20 Claims, 8 Drawing Sheets

METHOD AND APPARATUS FOR TESTING ERROR CORRECTION CODE (ECC) LOGIC AND PHYSICAL MEMORY ONBOARD A MANUFACTURED INTEGRATED CIRCUIT (IC)

TECHNICAL FIELD

The present invention relates to methods, devices, systems, and computer-readable media for testing memory components of integrated circuit designs; and in addition, the invention relates to an integrated circuit implementing elements to provide tests relating to memory components, including both the error correction code logic and the physical memory.

BACKGROUND

Integrated Circuit ("IC") design involves several phases including at least one testing phase. The tests used to check the design features are generated during a Design for Test ("DFT") phase. The DFT features are also integrated directly onto the IC. Using DFT techniques, a designer can comprehensively test the manufactured IC for quality and coverage. Typically, the testability features included on the IC facilitate manufacturing tests to ensure that the components of the IC behave in a manner consistent with the expected component behavior.

Different IC standards of reliability are demanded across industries. Many different industries rely on technical inventions that include IC design with a memory component. Some of these industries require that these memory component ICs meet their zero-defect policy for faults in on-board memory components. For example, automotive and health industries require that ICs used in their products are produced using a high silicon quality and that the ICs are produced reliably without manufacturing faults. Memory components used in the automobile industry must be subjected to strict tests and pass without failure due to the inherent risk to human safety when an IC and/or its associated memory component has a fault or fails. Similarly, memory components used in the medical devices industry must also be subjected to strict tests and pass without failure due to their usage in protecting, monitoring, and correcting human health issues. In these industries, an uncorrected fault or failure could contribute to an accident or loss of human life. Faults of an IC and its associated memory component in medical devices and automobiles, therefore, are subject to strict testing regulations.

The Joint Test Action Group ("JTAG") Institute of Electrical and Electronics Engineers ("IEEE") Standard 1149.1, which is sometimes referred to as the IEEE Standard Test Access Port and Boundary-Scan Architecture, was adopted in 1990 to address the industry-wide need for standardized on-board test input pins. Using the input pins, the circuit, but not specifically the memory, can be tested and the output from the circuit can be diagnosed and/or repaired during the component's normal functional operation. To do so, the IEEE 1149.1 standard mandates the existence of a 16-state state machine, called a JTAG macro, and four (or optionally five) Test Access Ports ("TAP") to be present in designs. The five TAP pins include: (1) test instructions, (2) control pin one, (3) control pin two (optional), (4) serial test data input, and (5) serial test data output. Implementation of the JTAG IEEE 1149.1 is often integrated into an IC using the serial IEEE 1149.1 test bus and associated ASSET software.

As described above, IC design generally includes at least one on-chip memory device. Such a memory device could be volatile or non-volatile, and could include at least any of: Random-Access Memory ("RAM") such as Dynamic Random-Access Memory ("DRAM") or Static Random-Access Memory ("SRAM"); Read-Only Memory ("ROM") such as an Electronically Erasable Programmable Read-Only Memory ("EEPROM"); flash memory; solid-state storage; magnetic tape; hard disk drives; and optical drives. Moreover, industry demand has resulted in a steady increase in product memory density. To provide the demanded memory increase needed on board the ICs being developed, memory is now often integrated as embedded memory within digital signal processors (DSPs), application-specific integrated circuits (ASICs), and microprocessors. Testing of memory devices and/or memory boards is increasingly complicated and requires substantial time and resources.

Memory testing can be performed in one of two phases: during a pre-manufacturing design phase or on board the IC. As described below, before manufacturing, the IC design (not the physical memory) including a correction logic design, which is called Error Correction Code ("ECC") logic, is subjected to software testing and simulation. The software testing and/or simulation occurs when the design is modeled entirely using a programming language, such as Verilog or Very High Speed Integrated Circuit ("VHSIC") Hardware Description Language ("VHDL"), to describe the digital and mixed-signal systems. After the design phase the IC is manufactured and placed into, and on-board the IC, the physical memory (not the design, and not the ECC) is subjected to hardware testing.

In circumstances in which the memory components are subject to a zero-defect policy, Error Correction Code ("ECC") logic also is included on board the IC and applied to the memory components. The ECC logic is used to diagnose and then correct any data output from the memory that is diagnosed as faulty. The ECC logic can correct data output up to a predetermined number of faulty data bits of the memory. As mentioned in the foregoing, ECC logic is only tested using functional patterns while the IC is in a design-phase. The actual output from the physical memory is not tested using the ECC logic after the IC is manufactured. ECC logic is not tested, using functional patterns, after the manufacture of the IC because of the large number of test patterns ($2^n$) that would need to be applied to the input pins (n-inputs) of an IC using Automatic Test Pattern Generation ("ATPG"). ATPG is an electronic design automation method that is used to generate scan data that, when applied to the IC, enables the Automated Test Equipment ("ATE") to distinguish between the expected output data and the returned output data from the Design Under Test ("DUT"). Using the limited test pin budget available from the ATE during the ATPG, on-chip testing of the ECC logic could take years. In addition, on-chip testing of the ECC logic would not make sense because during ATPG the values stored in the memory are unknown, and therefore the values output by the ECC logic would be incomprehensible and have no value to the observer.

At the point in time when the memory is prepared, manufactured, and/or loaded onto the IC, the physical memory and its ability to hold supplied values at specified addresses is directly tested. Memory testing is completed on-board the IC using Memory Built-In Self-Test ("MBIST") hardware. The MBIST is capable of generating a series of read operations and a series of write operations, which are also known as algorithms, to load bits to and then subsequently unload the bits from the memory. A record of the loaded bits are compared to the bits unloaded from the memory for purposes of completing the MBIST test. Physical memories are only tested using the MBIST logic on-board the IC. Physical memory is not tested before the manufacture of the IC because the ability of a software modeled register to hold a value at a specific point in software memory is not representative of the ability of an actual hardware physical memory component to function properly.

The complexity of highly reliable chips demanded by the market continues to increase. In order to service the demands for these highly reliable chips, which are to be implemented in high-risk technologies, the results from the ECC tests and the physical memory tests must both be reliable. However, as the demands for these chips increase, the serialized testing of the ECC logic in design-mode and then the on-board testing of the physical memory with an MBIST is insufficient. The serial testing, the assumptions inherent to the serial testing, and the failure to address chip aging, among other concerns, obstruct the designer's ability to promise a completely reliable IC.

The currently available testing scheme, in which: (i) the ECC logic is not tested on-board the chip, and (ii) the ECC logic is tested only with a software design of a memory and not an actual physical memory as well as the other on-board IC connections, has not provided the most accurate and reliable test results. In addition, the current testing scheme for the memory components only checks the reliability of the ECC logic in a design phase. Failure to check the reliability of the ECC logic on-board the IC, particularly when the ICs are expected to have a long life span, can no longer be accepted in the high-risk industries. Moreover, modifications to the ICs are always expected to utilize a very small number of additional on-board components including gates and/or combinatorial logic. IC designers, with reliability concerns in mind, must still minimize the added logic for testing in order to meet customer demands for small chip size and minimize the cost per chip increase passed on to the consumer.

SUMMARY

In view of the foregoing, an objective according to one aspect of the present patent document is to provide device configurations and methods for testing a memory component of an integrated circuit by testing two different views of the memory component on board the IC, and furthermore, by reusing the same logic components on board the IC to perform the tests of the two different views. In so doing, a physically and cost efficient memory test is implemented. The methods and apparatus herein address, or ameliorate, at least one of the problems described as presenting post-manufacture of the IC as they relate to memory component testing. Accordingly, the method described herein provides a solution for loading test logic onto the memory component of the IC in a first view, limited to the physical memory component, and in a second view, including the logic-modified output from memory component (the ECC). Similarly, the method described herein provides a solution for switching between loading the test logic needed for the first view and the second view, without any additional complex logic needed on-board the IC.

In an example embodiment, the invention describes a method for testing for a fault in a memory component of an integrated circuit that includes a physical memory and an error correction logic, the method comprising:

receiving, from an interface controller, a test instruction at a built-in design for test processing device;

altering a routing logic on the integrated circuit based on the received test instruction;

generating a test string for testing the memory component;

storing, at an address, the generated test string in the memory component using at least one of the physical memory and the error correction logic; and checking data that was stored at the address by comparing an output from the memory component to an expected result.

The present invention relates to the manner in which the MBIST can be manipulated to test both of the physical memory and the ECC logic on-board the IC. According to the invention described herein, an IC once manufactured and installed in a system can still test the reliability of the ECC logic. Moreover, the manufactured and installed IC can also test the reliability of the physical memory. The apparatus used to test the memory components is actually interchangeably capable of testing the ECC logic and the physical memory on board the IC. In some embodiments described herein, the testing of the inputs and outputs from the physical memory of the IC is referred to as the results from a "first view." Similarly, the testing of the inputs and outputs from ECC logic is referred to as the results from a "second view."

In an example embodiment, the apparatus used to the test the physical memory is MBIST logic. The MBIST logic is included on-board the IC. The MBIST logic is provided in a location on the IC so that it can receive input from the output of the physical memory. In some embodiments, multiple registers (N) in memory each have an output and each register output is individually connected to one of N separate MBIST inputs. The MBIST logic is further provided in a location on the IC so that it can transmit output to the input of the physical memory. In some embodiments, multiple registers (N) in memory each have an input and each register input is individually connected to one of N separate MBIST outputs. In the event in which N registers of memory are connected to N separate MBIST logic elements, each of the N registers of memory has its output connected to a same one of the N total MBIST logic elements that is connected to its input.

In an example embodiment, the apparatus used to test the ECC logic is MBIST logic. The MBIST logic is included on-board the IC. The MBIST logic is provided from a location on the IC so that it can receive input from the output of the ECC view. In some embodiments, multiple registers (N) in ECC logic each have an output and each register output is individually connected to one of N separate MBIST inputs. The MBIST logic is further provided in a location on the IC so that it can transmit output to the input of the ECC view. In some embodiments, multiple registers (N) in ECC logic each have an input and each register input is individually connected to one of N separate MBIST outputs. In the event in which N registers of ECC logic are connected to N separate MBIST logic elements, each of the N registers of ECC logic has its output connected to a same one of the N total MBIST logic elements that is connected to its input.

DESCRIPTION OF EXEMPLARY EMBODIMENTS

The following description of exemplary embodiments provides non-limiting representative examples referencing numerals to particularly describe features and teachings of the invention. The embodiments described should be recognized as capable of implementation separately, or in combination, with other embodiments from the description of the exemplary embodiments. A person of skill in the art reviewing the description of exemplary embodiments should be able to learn and understand the different described aspects of the invention. The description of exemplary embodiments should facilitates understanding of the invention to such an extent that other implementations of the invention, not specifically covered but within the knowledge of a person of skill in the art having read the description of exemplary embodiments, would be understood to be consistent with an application of the invention.

In the foregoing Summary, various features are grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the foregoing Summary and following claims are hereby incorporated into this Description of the Exemplary Embodiments, with each claim standing on its own as a separate embodiment of the invention.

Figure 1:
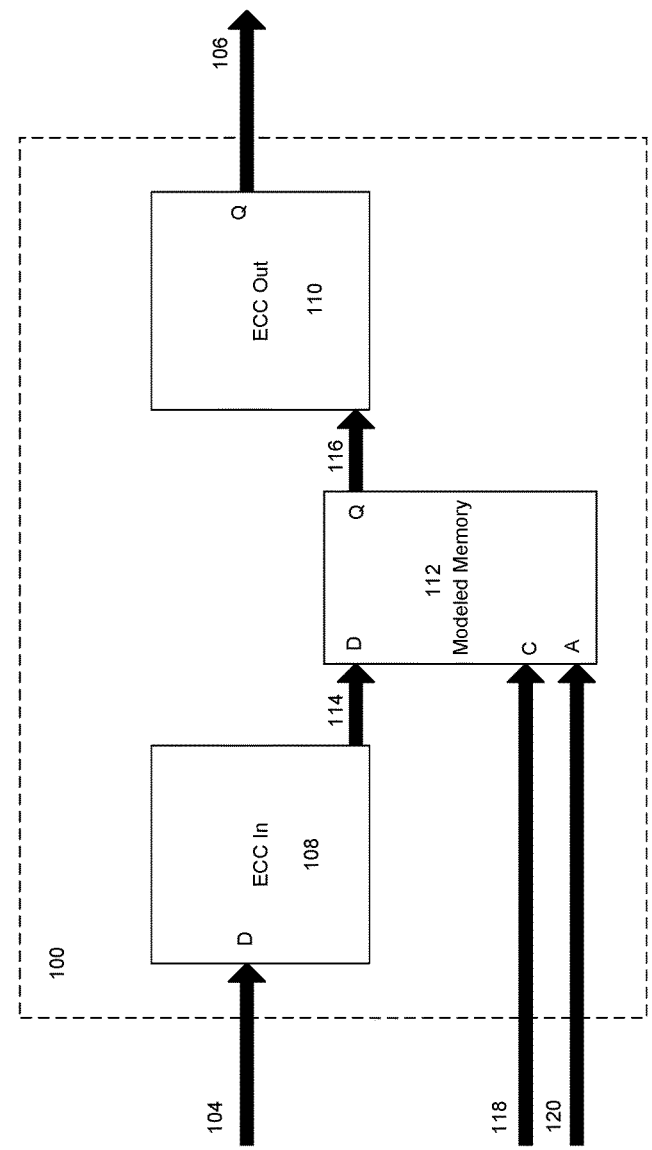
FIG. 1 illustrates application of virtual test stimuli from a test module to a design-phase simulated IC in order to check the reliability of the ECC logic.

FIG. 1 illustrates application of virtual test stimuli from a test module to a design-phase simulated IC in order to check the reliability of the ECC logic.

Functional patterns designed as part of the chip design phase and/or during the functional verification phase, are prepared to be applied to a design-phase simulated IC. The virtual test stimuli are not actually generated and applied to an IC via ATE. All descriptions related to FIG. 1 are strictly related to the employment of the model during a design phase.

The virtual test stimuli are applied to the test module and are observed from an ECC View 100 during a Design Phase 102. Within the ECC View 100, the available ECC logic includes ECC-In Register 108 and ECC-Out Register 110. In some embodiments, ECC-In Register 108 and ECC-Out Register 110 are included in a single logical arrangement that interacts with the Modeled Memory 112. The inputs to the ECC view 100 include at least a Data Input to ECC View ("D") 104, a Control Pin to Modeled Memory ("C") 118, and an Address Pin to Modeled Memory ("A") 120. The outputs from the ECC view 100 include at least a Data Output from ECC View ("Q") 106.

Upon a first modeled latching activity (e.g., a rising edge or a falling edge of a digitally implemented clock), the ECC-In Register 108 receives the Data Input to ECC View ("D") 104. The ECC-In Register 108 proceeds to manipulate the data 104 provided from the D pin. The data manipulation performed by the ECC-In Register 108 can in some embodiments involve concatenating at least one additional bit to the originally provided bit string. The at least one additional bit string is generated and attached to the original bit string by the ECC-In Register in order to provide a check-bit. A check-bit may alternatively be referred to, in some embodiments, as a parity bit. The addition of this information enables the ECC Logic to, at a later point in time, determine whether the code includes errors. Generally, the check bit is added to the end (e.g., after the last bit in the transmission line) of the original bit string. In some embodiments, the check bit is provided at the first end of the original bit string, and in some embodiments, the check bit is inserted between bits in the original bit string.

At the same first modeled latching activity, or a predetermined number of delayed latching activities following the first modeled latching activity, the control data is received at the Control Pin to Modeled Memory 112, the address data is received at the Address Pin to Modeled Memory 112, and the manipulated Data Input is passed through a line 114 to the Input to Modeled Memory ("D") 114. The manipulated Data Input passed through line 114 has a bit length that exceeds the length of the original bit string by the length of the check bit string.

The address data received at the Address Pin of Modeled Memory 112 refers to the location at which the next word, or string of data bits, received at "D" of the Modeled Memory 112 is to be accessed for one of storage or retrieval. The control data received at the Control Pin of Modeled Memory 112 could provide a variety of different information. In some embodiments, the control data enables the Modeled Memory 112 for data storage, as opposed to other modeled memories within the platform in the Design Phase 102. In some embodiments, the control data is a clock signal, which provides the Modeled Memory 112 with the ability to synchronize data storage on the virtual memory stack. In some embodiments, the control data indicates whether the Modeled Memory 112 is receiving data upon a latch according to a Write Operation. In some embodiments, the control data indicates whether the Modeled Memory 112 is transmitting data upon a latching according to a Read Operation. In some embodiments, several different types of control data are provided on a plurality of Control Pins available on the Modeled Memory 112.

Upon receipt of at least the address data at the address pin, the modified data passed from the ECC-In Register 108 at the "D" pin of the Modeled Memory 112 and the enable for a write operation included in the control data at the control pin, the Modeled Memory stores the received data bits at the address provided in the received address data. For example, the modified data string <1 0 1 0 0 1 1 1> is received at the D pin of the Modeled Memory 112. The last portion of the modified data string, <1 1 1> is the check-bit concatenated by the ECC-In Register 108 to the original data string <1 0 1 0 0>. The address 0x9999 is provided as the address data from 120 at the address pin A of the Modeled Memory 112. Therefore, the Modeled Memory 112 stores the modified data string in its entirety, <1 0 1 0 0 1 1 1> at address 0x9999 in its stack.

After a predetermined number of cycles, or upon a predetermined latching activity, the Modeled Memory transmits data from its stack. Upon receipt of at least the address data at the address pin and the enable for a read operation included in the control data at the control pin, the Modeled Memory transmits the modified memory data stored in its stack at the address provided in the received address data. For example, when the address 0x9999 is provided as the address data from 120 at the address pin A of the Modeled Memory 112 and a read operation is enabled, the Modeled Memory 112 transmits the modified data string <1 0 1 0 0 1 1 1> from the Output from Modeled Memory ("Q") 116.

The data provided from the Q pin of the Modeled Memory is received by the ECC Logic at ECC-Out Register 110. The ECC-Out Register 110 analyzes the output from the physical memory, including the concatenated bits. The ECC-Out Register 110 removes the concatenated bits. Then, the ECC-Out Register includes logic that modifies the string of bits, as necessary, based on any errors that were reported from the data included in the check-bits to correct any faults. The corrected data is provided upon a latching activity at the output pin Q of the ECC-Out Register 110 so that it is the Data Output from ECC View ("Q") 106. If there were no errors in the data string according to the check bit data, then the bit string minus the concatenated bits is provided upon a latching activity at the output pin Q of the ECC-Out Register 110.

Figure 2:
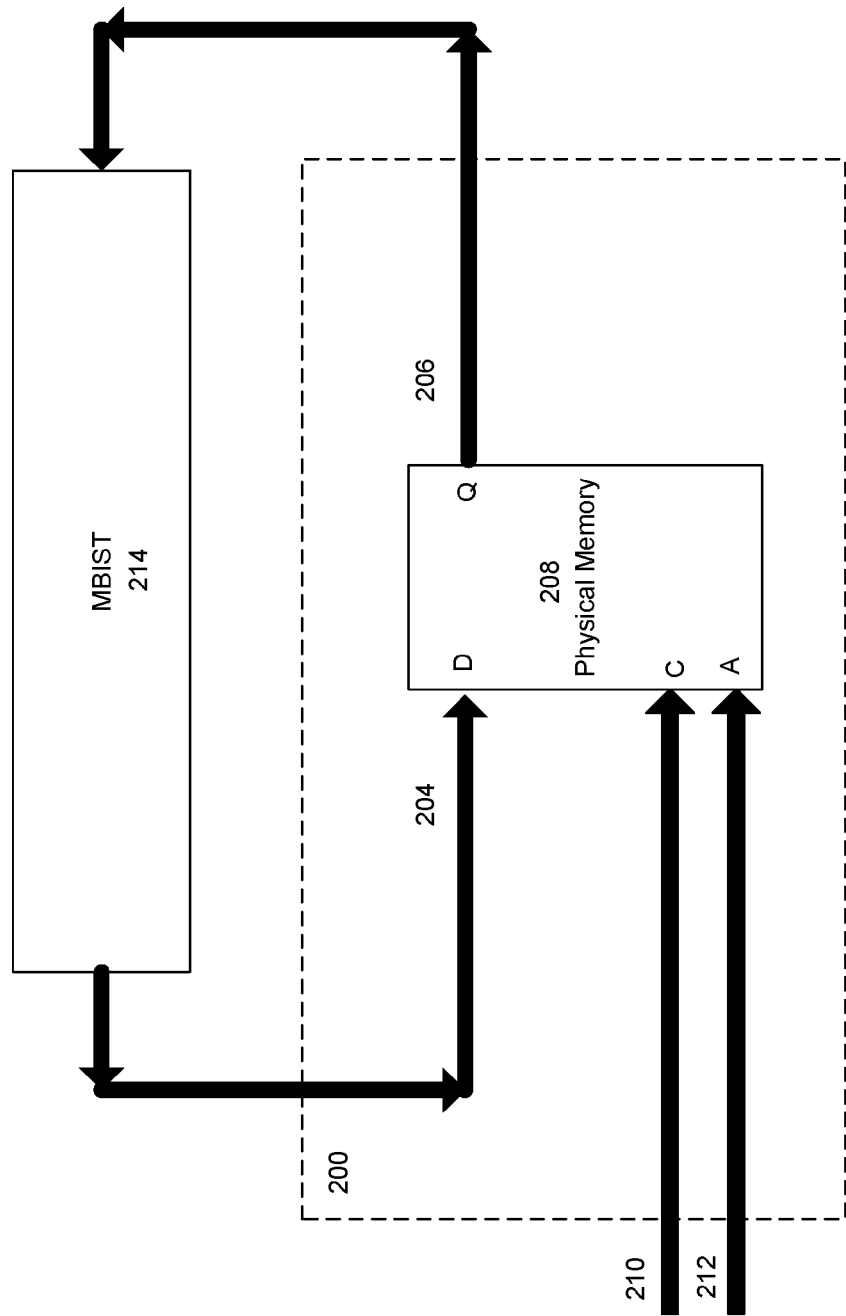
FIG. 2 illustrates application of test stimuli from an MBIST logic hardware element to a physical memory on board a manufactured IC in order to check the reliability of the physical memory.

FIG. 2 illustrates application of test stimuli from an MBIST logic hardware element to a physical memory on board a manufactured IC in order to check the reliability of the physical memory.

After the IC has been manufactured, test stimuli are applied to the physical memory during a real-time test. The test stimuli may be designed during the ATPG, but the test stimuli are stored on board the IC in order to administer the real-time test whenever deemed necessary by the programmer and/or tester of the memory. All descriptions related to FIG. 2 are strictly related to the employment of the memory testing with a physical memory.

The test stimuli are applied to the physical memory and are observed from a Physical Memory View 200 on a Manufactured Chip 202. The logic used to complete the testing of the physical memory is supplied from outside of the Physical Memory View 200. In particular, the logic used to complete the testing is included in the MBIST Logic 214. The MBIST Logic 214 is provided as an input, Input to Physical Memory View ("D") 204, to the Physical Memory View 200. Other inputs to the Physical Memory View 200 include at least control data and address data. The outputs from the Physical Memory View 200 include at least the Output from the Physical Memory View ("Q") 206, which is transmitted to the MBIST Logic 214.

Within the Physical Memory View 200 is the Physical Memory 208. Upon a first physical latching activity (e.g., a rising edge or a falling edge of a clock), the pin for the Input to Physical Memory View ("D") 204 receives data from the MBIST 214. The received data includes a string of bits for storage in the Physical Memory 208.

At the same first physical latching activity, the control data and the address data is received by the Physical Memory 208. At a pin reserved for the control data, Control Pin to Physical Memory ("C") 210, the Physical Memory 208 receives the control data. At a pin reserved for the address data, Address Pin to Physical Memory ("A") 212, the Physical Memory 208 receives the address data.

The address data received at the Address Pin of Physical Memory 208 refers to the location at which the next word, or string of data bits, received at "D" of the Physical Memory 208 is to be accessed for one of storage or retrieval. The control data received at the Control Pin of Physical Memory 208 could provide a variety of different information. In some embodiments, the control data enables the Physical Memory 208 for data storage, as opposed to other physical memories on the IC. In some embodiments, the control data is a clock signal, which provides the Physical Memory 208 with the ability to synchronize data storage on the physical memory stack. In some embodiments, the control data indicates whether the Physical Memory 208 is receiving data upon a latch according to a Write Operation. In some embodiments, the control data indicates whether the Physical Memory 208 is transmitting data upon a latching according to a Read Operation. In some embodiments, several different types of control data are provided on a plurality of Control Pins available on the Physical Memory 208.

Upon receipt of at least the address data at the address pin, the data passed in from the MBIST logic at the "D" pin of the Physical Memory 208 and the enable for a write operation included in the control data at the control pin, the Physical Memory stores the received data bits at the address provided in the received address data. For example, the data string <1 0 1 0 0 1 1 1> is received at the D pin of the Physical Memory. The address 0x9999 is provided as the address data from 212 at the address pin A of the Physical Memory 208. Therefore, the Physical Memory 208 stores the data string in its entirety, <1 0 1 0 0 1 1 1> at address 0x9999 in its stack.

After a predetermined number of cycles, or upon a predetermined latching activity, the Physical Memory transmits data from its stack. Upon receipt of at least the address data at the address pin and the enable for a read operation included in the control data at the control pin, the Physical Memory transmits the memory data stored in its stack at the address provided in the received address data. For example, when the address 0x9999 is provided as the address data from 212 at the address pin A of the Physical Memory 208 and a read operation is enabled, the Physical Memory 208 transmits the data string <1 0 1 0 0 1 1 1> from the Output from Physical Memory View ("Q") 206.

The data provided from the Q pin of the Physical Memory is received by the MBIST Logic 214. The MBIST Logic 214 analyzes the output from the physical memory. In particular, the MBIST Logic 214 compares the data received from the Output Q 206 to the expected data, which it had initially transmitted to the D pin of the Physical Memory. Various means for comparing the data could be employed to execute the comparison. In some embodiments, a comparator is implemented. In some embodiments, combinatorial logic is implemented to execute the comparison. Other comparison means known to those of ordinary skill in the art could be similarly employed. The expected data is provided to the comparison means from a register containing the expected data. The expected data is in some embodiments loaded into the register from a static memory element. In other embodiments, the expected data is loaded into the register from a dynamic memory element. An output signal from the MBIST, relating to the results of the comparison is provided to another module of the Manufactured Chip 202 that can either execute a warning signal or transmit a warning signal. In some embodiments, the output signal is a warning signal when the comparison results indicate a mismatch between the data received from the Output Q 206 and the expected data. In some embodiments when a macro is employed for this particular purpose, the output signal is a signal indicating the success of the comparison when the comparison indicates a match between the data received from the Output Q 206 and the expected data. In some embodiments when a macro is employed for this particular purpose, the output signal is set to a signal indicating the success of the comparison even if the data received from the Output Q 206 and the expected data are not a match but within a predetermined tolerance for a fault. For example, an N-bit (or less than N-bit) mismatch, where N is predetermined or preset by the manufacturer of the Manufactured Chip 202 as within a tolerance range may still result in the sending of the signal indicating the success of the comparison. In addition, in the event of a tolerable N-bit mismatch, the signal indicating the success of the comparison further includes data regarding the number of bits that were mismatched.

Figure 3:
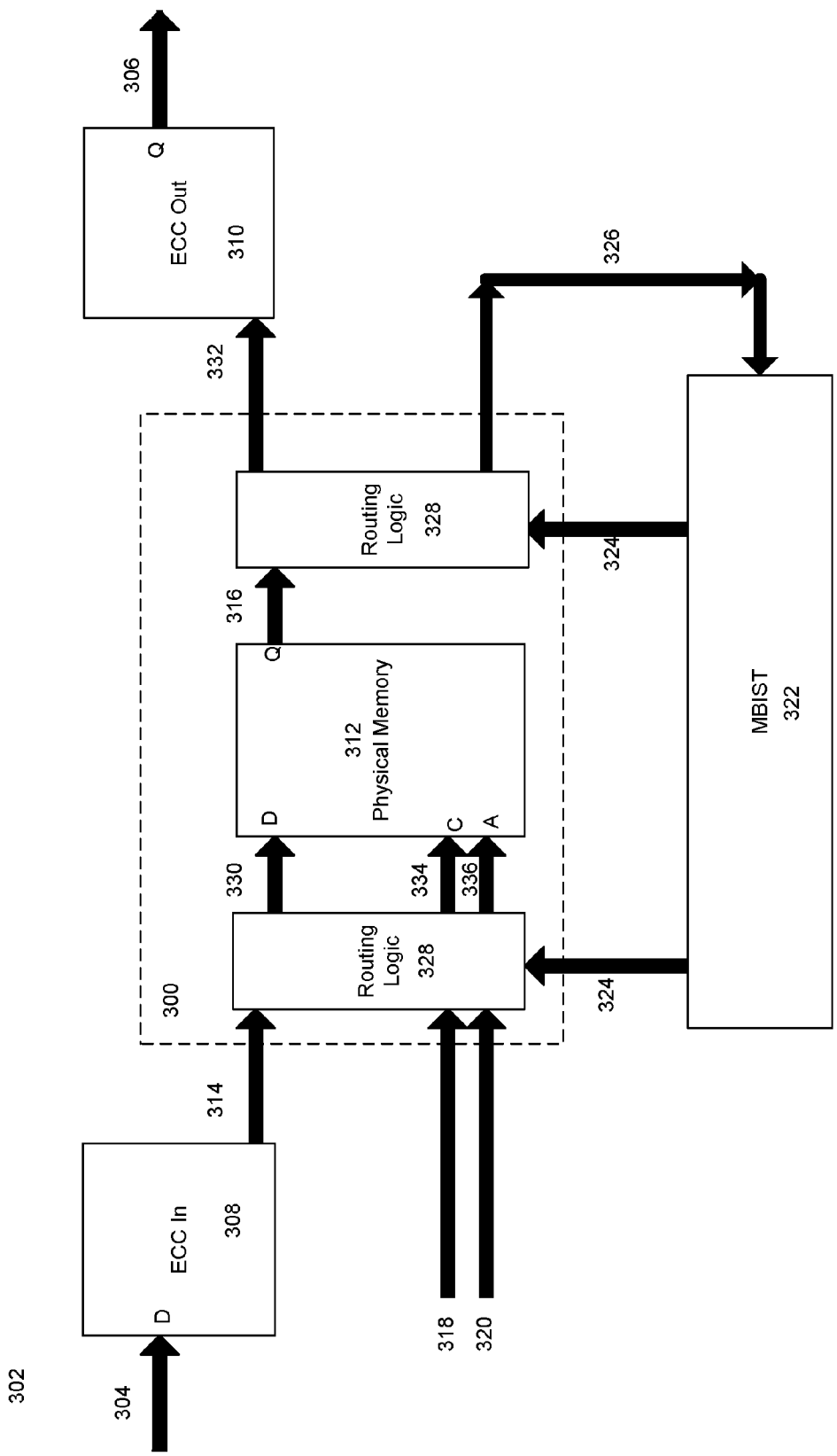
FIG. 3 illustrates application of test stimuli from an MBIST logic hardware element to a physical memory on-board a manufactured IC, when the testing is enabled in a physical memory mode, in order to check the reliability of the physical memory.

FIG. 3 illustrates application of test stimuli from an MBIST logic hardware element to a physical memory on-board a manufactured IC, when the testing is enabled in a physical memory mode, in order to check the reliability of the physical memory.

The manufactured IC is provided in FIG. 3 as 302. On 302, a test of the Physical Memory View 300 is executed. For the purposes of discussion with regard to FIG. 3, some signals are disregarded with the understanding that their counterpart signals will be described in more detail in FIG. 4. For example, the Input to ECC View ("D") 304 and the Output from ECC View ("Q") 306 are shown in the Figure, but they will be described in greater detail in FIG. 4 as feature 404 and 406, respectively.

After the IC has been manufactured, test stimuli are applied to the physical memory during a real-time test. The test stimuli may be designed during the ATPG, but the test stimuli are stored on board the IC in order to administer the real-time test whenever deemed necessary by the programmer and/or tester of the memory.

The test stimuli are applied to the physical memory and are observed from a Physical Memory View 300 on a Manufactured Chip 302. The logic used to complete the testing of the physical memory is supplied from outside of the Physical Memory View 300. In particular, the logic used to complete the testing is included in the MBIST Logic 322. The MBIST Logic 322 is provided as an input to the Physical Memory View 300. In addition to the MBIST Logic 322, other inputs to the Physical Memory View 300 include an output from ECC-In Register 308 along line 314, address data along line 320 and control data along line 318. These inputs, 314, 318, 320, and 324, are received by Routing Logic 328. Routing Logic, in FIG. 3, is enabled by the MBIST 322 to operate in a Physical Memory testing mode. Accordingly, input from ECC-In Register 308 is discarded. MBIST test data, provided by the MBIST along line 324, is passed through the Routing Logic 328 as the Input to Physical Memory ("D") along line 330. The Routing Logic 328 passes the control data from line 324 to line 334, which is received by the Physical Memory 312 at the control C pin. The Routing Logic 328 also passes the address data from line 324 to line 336, which is received by the Physical Memory 312 at the address A pin.

Within the Physical Memory View 300 is the Physical Memory 312. Upon a first physical latching activity (e.g., a rising edge or a falling edge of a clock), the pin for the Input to Physical Memory View ("D") 330 receives the data from the MBIST 322. The received data includes a string of bits for storage in the Physical Memory 312.

At the same first physical latching activity, the control data and the address data is received by the Physical Memory 312. At a pin reserved for the control data, Control Pin to Physical Memory ("C") 334, the Physical Memory 312 receives the control data. At a pin reserved for the address data, Address Pin to Physical Memory ("A") 336, the Physical Memory 312 receives the address data.

The address data received at the Address Pin of Physical Memory 312 refers to the location at which the next word, or string of data bits, received at "D" of the Physical Memory 312 is to be accessed for one of storage or retrieval. The control data received at the Control Pin of Physical Memory 312 could provide a variety of different information. In some embodiments, the control data enables the Physical Memory 312 for data storage, as opposed to other physical memories on the IC. In some embodiments, the control data is a clock signal, which provides the Physical Memory 312 with the ability to synchronize data storage on the physical memory stack. In some embodiments, the control data indicates whether the Physical Memory 312 is receiving data upon a latch according to a Write Operation. In some embodiments, the control data indicates whether the Physical Memory 312 is transmitting data upon a latching according to a Read Operation. In some embodiments, several different types of control data are provided on a plurality of Control Pins available on the Physical Memory 312.

Upon receipt of at least the address data at the address pin, the data passed in from the MBIST logic at the "D" pin of the Physical Memory 312 and the enable for a write operation included in the control data at the control pin, the Physical Memory stores the received data bits at the address provided in the received address data. For example, the data string <1 0 1 0 0 1 1 1> is received at the D pin of the Physical Memory. The address 0x9999 is provided as the address data from 336 at the address pin A of the Physical Memory 312. Therefore, the Physical Memory 312 stores the data string in its entirety, <1 0 1 0 0 1 1 1> at address 0x9999 in its stack.

After a predetermined number of cycles, or upon a predetermined latching activity, the Physical Memory transmits data from its stack. Upon receipt of at least the address data at the address pin and the enable for a read operation included in the control data at the control pin, the Physical Memory transmits the memory data stored in its stack at the address provided in the received address data. For example, when the address 0x9999 is provided as the address data from 336 at the address pin A of the Physical Memory 312 and a read operation is enabled, the Physical Memory 312 transmits the data string <1 0 1 0 0 1 1 1> from the Output from Physical Memory View ("Q") 316.

The data provided from the Q pin of the Physical Memory is provided by Routing Logic 328 back to the MBIST Logic 322. The MBIST Logic 322 analyzes the output from the physical memory. In particular, the MBIST Logic 322 compares the data received from the Output Q 316 to the expected data, which it had initially transmitted to the D pin of the Physical Memory. Various means for comparing the data could be employed to execute the comparison. In some embodiments, a comparator is implemented. In some embodiments, combinatorial logic is implemented to execute the comparison. Other comparison means known to those of ordinary skill in the art could be similarly employed. The expected data is provided to the comparison means from a register containing the expected data. The expected data is in some embodiments loaded into the register from a static memory element. In other embodiments, the expected data is loaded into the register from a dynamic memory element. In other embodiments, the expected data is buffered for a predetermined number of clock cycles. An output signal from the MBIST, relating to the results of the comparison is provided to another module of the Manufactured Chip 302 that can either execute a warning or transmit a warning signal. In some embodiments, the output signal is a warning signal when the comparison results indicate a mismatch between the data received from the Output Q 316 and the expected data. In some embodiments, the output signal is a signal indicating the success of the comparison when the comparison indicates a match between the data received from the Output Q 316 and the expected data. In some embodiments, the output signal is set to a signal indicating the success of the comparison even if the data received from the Output Q 316 and the expected data are not a match but within a predetermined tolerance for a fault. For example, an N-bit (or less than N-bit) mismatch, where N is predetermined or preset by the manufacturer of the Manufactured Chip 302 as within a tolerance range may still result in the sending of the signal indicating the success of the comparison. In addition, in the event of a tolerable N-bit mismatch, the signal indicating the success of the comparison further includes data regarding the number of bits that were mismatched.

Figure 4:
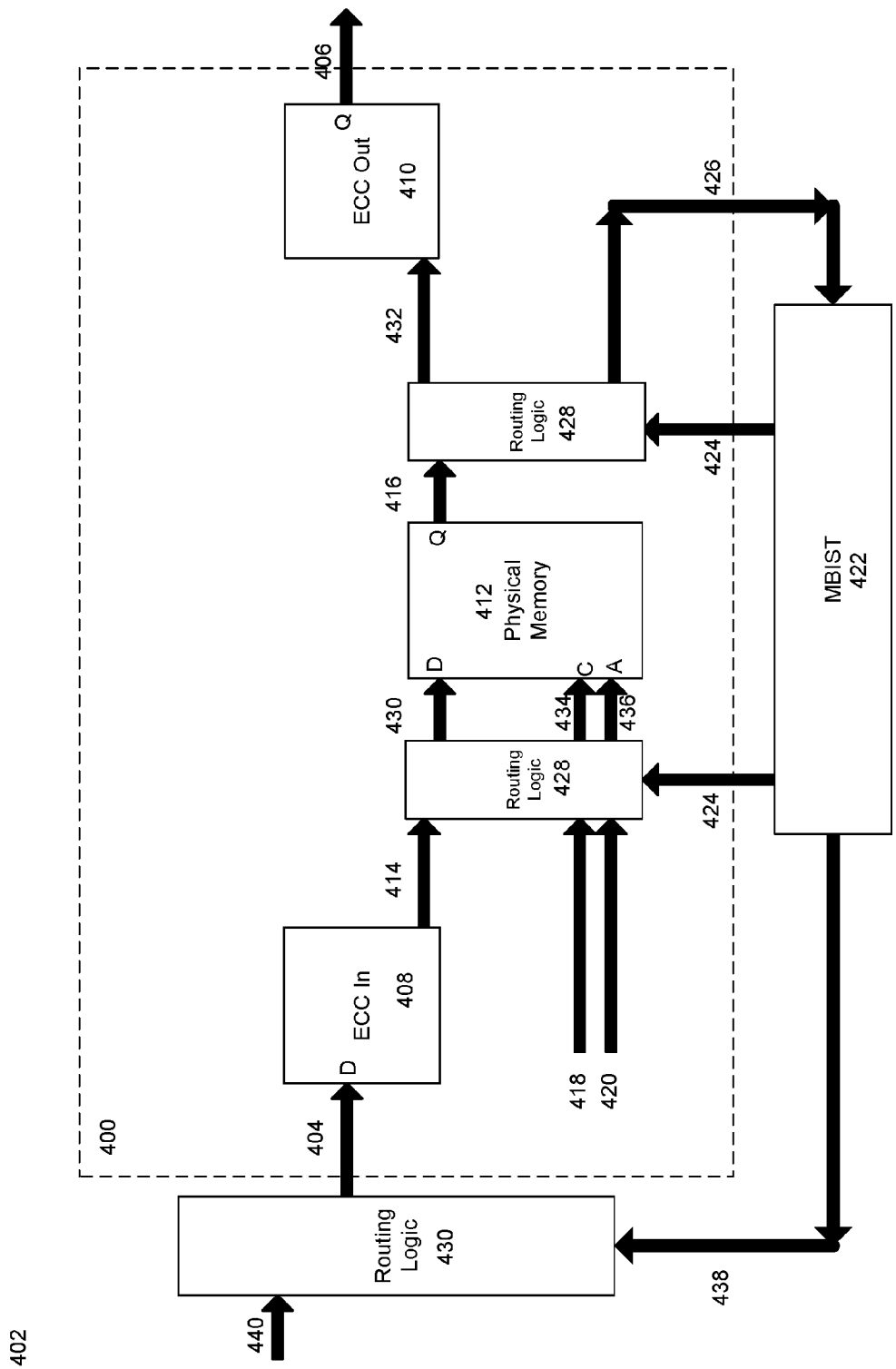
FIG. 4 illustrates application of test stimuli from an MBIST logic hardware element to ECC logic and the physical memory on-board a manufactured IC, when the testing is enabled in an ECC mode, in order to check the reliability of the ECC logic.

FIG. 4 illustrates application of test stimuli from an MBIST logic hardware element to ECC logic and the physical memory on-board a manufactured IC, when the testing is enabled in an ECC mode, in order to check the reliability of the ECC logic.

Provided that ECC logic is included for test on a system and IC operating in real-time, the overall test environment remains compatible for functional operation. Therefore, the IC 402, which includes an ECC View 400, also include Routing Logic 430 to switch between functional operation and ECC test mode. Accordingly, test stimuli, designed as a part of ATPG, are prepared to be applied to the IC in real-time when the system is not operating in a functional mode. The MBIST Logic 422 provides a line 438, which includes a signal that indicates whether the Routing Logic 430 will transmit to the ECC-In Register 408 either the live functional data from live-stream 440 or the test data provided by the MBIST 422. If the signal on line 438 indicates that the ECC Logic is to receive test data from the MBIST 422, the Routing Logic transmits the test data which is provided from the MBIST 422 along line 438 to the Input to the ECC Logic line 404. If the signal on line 438 indicates that the ECC Logic is to receive functional data, the Routing Logic transmits the live-stream of functional data form line 440 to the Input to the ECC Logic line 404.

The functional data, or the test stimuli, is applied to the ECC Logic and is observed from an ECC View 400. Within the ECC View 400, the available ECC logic includes ECC-In Register 408 and ECC-Out Register 410. In some embodiments, ECC-In Register 408 and ECC-Out Register 410 are included in a single logical arrangement that interacts with the Physical Memory 412. The inputs to the ECC view 400 include at least a Data Input to ECC View ("D") 404, a Control Pin to Physical Memory ("C") 418, and an Address Pin to Physical Memory ("A") 420. The outputs form the ECC view 400 include at least a Data Output from ECC View ("Q") 406.

Upon a first latching activity (e.g., a rising edge or a falling edge of a digitally implemented clock), the ECC-In Register 408 receives the Data Input to ECC View ("D") 404. The ECC-In Register 408 proceeds to manipulate the data 404 provided from the D pin. The data manipulation performed by the ECC-In Register 408 can in some embodiments involve concatenating at least one additional bit to the originally provided bit string. The at least one additional bit string is generated and attached to the original bit string by the ECC-In Register in order to provide a check-bit. A check-bit may alternatively be referred to, in some embodiments, as a parity bit. The addition of this information enables the ECC Logic to, at a later point in time, determine whether the code includes errors. Generally, the check bit is added to the end (e.g., after the last bit in the transmission line) of the original bit string. In some embodiments, the check bit is provided at the first end of the original bit string, and in some embodiments, the check bit is inserted between bits in the original bit string.

At the same first latching activity, or a predetermined number of delayed latching activities following the first latching activity, the control data is received at the Control Pin to Physical Memory 412, the address data is received at the Address Pin to Physical Memory 412, and the manipulated Data Input is passed through a line 414 to the Routing Logic 428. Routing Logic 428, in FIG. 4, is enabled by the MBIST 422 to operate in a ECC-Logic testing mode (or a functional mode). Accordingly, input from ECC-In Register 408 is transmitted, as opposed to the MBIST test data, is passed through the Routing Logic 428 as the Input to Physical Memory ("D") along line 430. The Routing Logic 428 passes the control data from line 418 to line 434, which is received by the Physical Memory 412 at the control C pin. The Routing Logic 428 also passes the address data from line 420 to line 436, which is received by the Physical Memory 412 at the address A pin. The manipulated Data Input that is transmitted through line 414 has a bit length that exceeds the length of the original bit string, which was provided along line 404, by the length of the check bit string.

The address data received at the Address Pin of Physical Memory 412 refers to the location at which the next word, or string of data bits, received at "D" of the Physical Memory 412 is to be accessed for one of storage or retrieval. The control data received at the Control Pin of Physical Memory 412 could provide a variety of different information. In some embodiments, the control data enables the Physical Memory 412 for data storage, as opposed to other memories onboard the IC 402. In some embodiments, the control data is a clock signal, which provides the Physical Memory 412 with the ability to synchronize data storage on the memory stack. In some embodiments, the control data indicates whether the Physical Memory 412 is receiving data upon a latch according to a Write Operation. In some embodiments, the control data indicates whether the Physical Memory 412 is transmitting data upon a latching according to a Read Operation. In some embodiments, several different types of control data are provided on a plurality of Control Pins available on the Physical Memory 412.

Upon receipt of at least the address data at the address pin, the modified data passed from the ECC-In Register 408 at the "D" pin of the Physical Memory 412 and the enable for a write operation included in the control data at the control pin, the Physical Memory stores the received data bits at the address provided in the received address data. For example, the modified data string <1 0 1 0 0 1 1 1> is received at the D pin of the Physical Memory 412. The last portion of the modified data string, <1 1 1> is the check-bit concatenated by the ECC-In Register 408 to the original data string <1 0 1 0 0>. The address 0x9999 is provided as the address data from 420 at the address pin A of the Physical Memory 412. Therefore, the Physical Memory 412 stores the modified data string in its entirety, <1 0 1 0 0 1 1 1> at address 0x9999 in its stack.

After a predetermined number of cycles, or upon a predetermined latching activity, the Physical Memory transmits data from its stack. Upon receipt of at least the address data at the address pin and the enable for a read operation included in the control data at the control pin, the Physical Memory transmits the modified memory data stored in its stack at the address provided in the received address data. For example, when the address 0x9999 is provided as the address data from 420 at the address pin A of the Physical Memory 412 and a read operation is enabled, the Physical Memory 412 transmits the modified data string <1 0 1 0 0 1 1 1> from the Output from Physical Memory ("Q") 416. The line 416 passes through Routing Logic 428. The Routing Logic 428 is in ECC-View or Functional mode, and accordingly the data from line 416 is provided directly to the ECC-Out Register and is not checked directly by the MBIST 422.

The data provided from the Q pin of the Physical Memory is received by the ECC Logic at ECC-Out Register 410. The ECC-Out Register 410 analyzes the output from the physical memory, including the concatenated bits. The ECC-Out Register 410 removes the concatenated bits. Then, the ECC-Out Register includes logic that modifies the string of bits, as necessary, based on any errors that were reported from the data included in the check-bits to correct any faults. The corrected data is provided upon a latching activity at the output pin Q of the ECC-Out Register 410 so that it is the Data Output from ECC View ("Q") 406. If there were no errors in the data string according to the check bit data, then the bit string minus the concatenated bits is provided upon a latching activity at the output pin Q of the ECC-Out Register 410.

Figure 5:
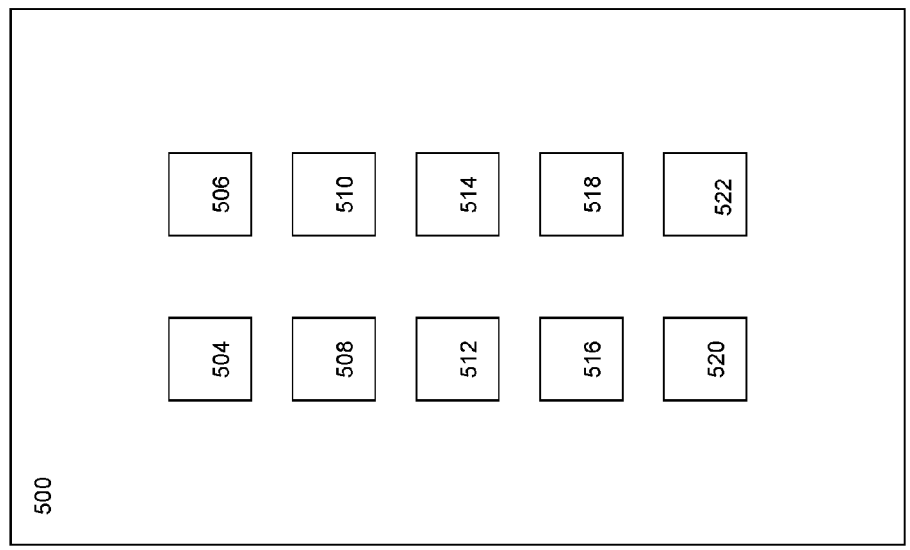
FIG. 5 illustrates a standardized macro capable of interfacing with the circuits of FIG. 3 and FIG. 4 in order to enable the physical memory mode or the ECC mode.

FIG. 5 illustrates a standardized macro capable of interfacing with the circuits of FIG. 3 and FIG. 4 in order to enable the physical memory mode or the ECC mode. The five connector pins on the JTAG are the: Test Data In ("TDI"), Test Data Out ("TDO"), Test Clock ("TCK"), Test Mode Select ("TMS"), and Test Reset ("TRST"). The clock input available to the tester is available at the TCK pin. The other pins provide signals that are synchronous to TCK. The TCK pin is a control pin and provides a control signal, consistent with the foregoing and following description. The input data stream to be applied to the IC is provided to the TDI pin. The output data stream available for analysis from the IC is provided from the TDO pin. The data provided on the TMS is sampled on the rising edge of TCK to determine which of the JTAG states will next be applied. The JTAG includes a Test Access Ports ("TAP") controller, which is a state machine with 16 states. The TMS pin controls the behavior of the TAP controller on the IC to which the JTAG is connected. The TMS pin is a control pin and provides a control signal, consistent with the foregoing and following description. The TRST pin, when available, is used to reset the test logic. If the TRST pin is unavailable, the TCK and TMS pins can together be used to reset the test logic. In some embodiments, the JTAG further includes a TEST pin, which is used to enable other JTAG pins. The TEST pin is a control pin and provides a control signal, consistent with the foregoing and following description.

By executing instructions provided in a programming language compatible with the JTAG controller, the TAP controller on the JTAG can be manipulated into different states that drive the flow of data on the IC. The instructions are used, in some circumstances, to designate whether a specific module or subunit on the IC is enabled for receipt of further instructions. The instructions are further used to communicate with the designated device/module whether to execute a read or write operation. Instructions can further provide, to the designated device/module device address bits, data bits, and clock signals.

The actual physical embodiment of the JTAG Interface can be any of ARM 10-PIN Interface, ARM 14-PIN Interface, ARM 20-PIN Interface, AVR JTAG, Altera ByteBlaster, ST 14-PIN Interface, OCDS 16-PIN Interface, XILINX JTAG, or XILINX JTAG 9-PIN, depending on a design choice of the programmer. Other similar JTAG devices, or devices capable of implementing the JTAG logic as would be understood by one of ordinary skill in the art, are considered incorporated herein.

A sample IC 502 having a JTAG Pin Interface 500 is provided in FIG. 5. On the JTAG Pin Interface 500, multiple pins 504, 506, 508, 510, 512, 514, 516, 518, 520, and 522 are available. Assignments of pins described herein are for example purposes only and are non-limiting. Other pin assignments are omitted for purposes of brevity. Other known pin interfaces, or target connectors, to one of ordinary skill in the art are considered incorporated herein.

Pin 504 included on JTAG Pin Interface 500 is a Voltage at the Common Collector ("VCC") pin. Pin 504 receives the positive supply voltage that is used for all JTAG interface drivers. Pin 506 is the TMS pin, which receives the TMS signal described in the foregoing. Pin 508 is a ground pin. Pin 510 is the TCLK pin, which receives the TCK signal described in the foregoing. Pin 512 included on JTAG Pin Interface 500 is a ground pin. Pin 514 included on JTAG Pin Interface 500 is the TDO pin, which receives the TDO signal described in the foregoing. Pin 516 is the RTCK pin, which is a return test clock signal and which is used to enable the JTAG interface. Pin 518 is the TDI pin, which receives the TDI signal described in the foregoing. Pin 520 is a ground pin. Pin 522 is the RESET pin, which receives the TRST signal described in the foregoing.

Figure 6:
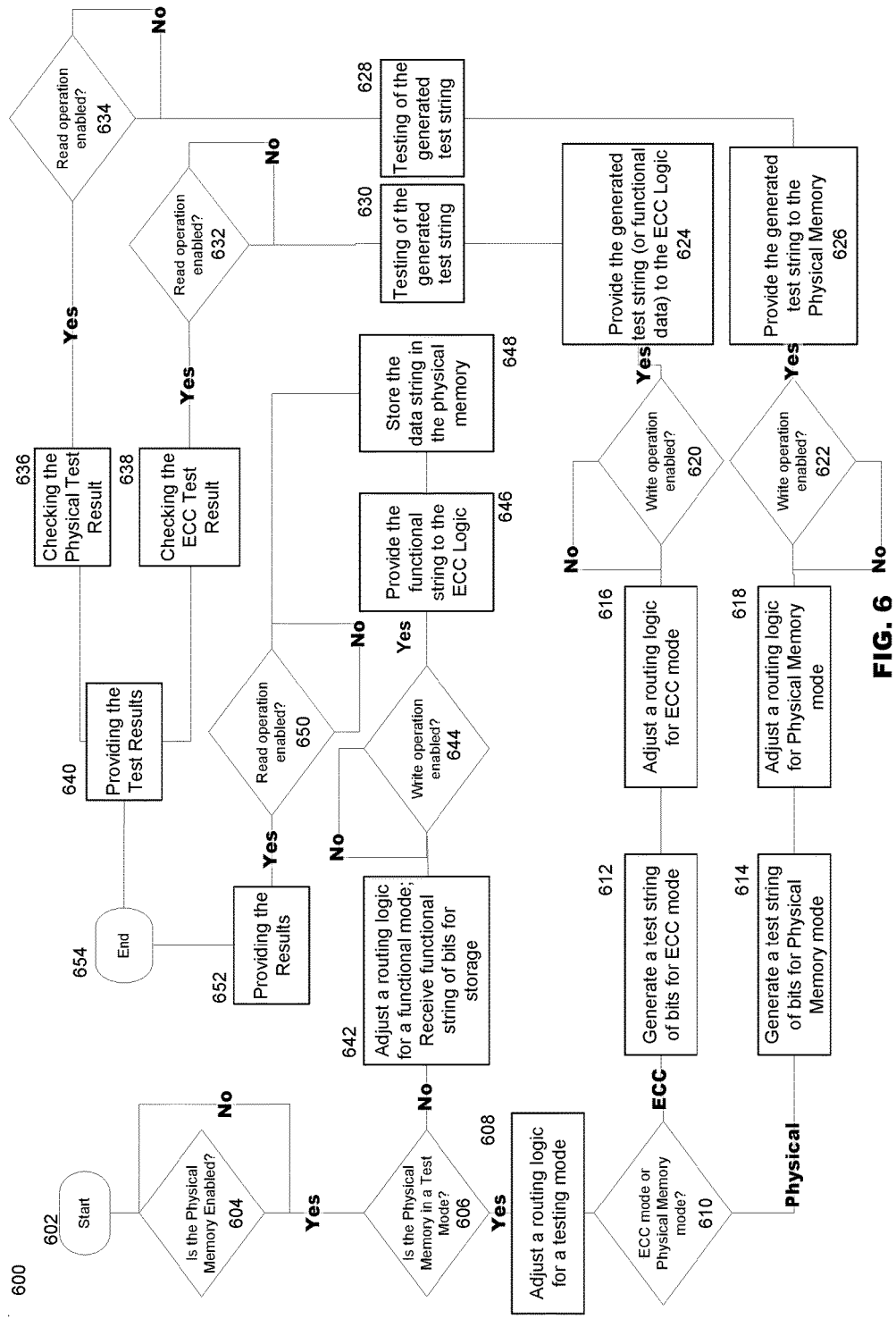
FIG. 6 illustrates a flowchart describing how to enable the testing of the circuits of FIG. 3 and FIG. 4.

FIG. 6 illustrates a flowchart describing how to enable the testing of the circuits of FIG. 3 and FIG. 4.

At 602, the method begins. At 604, it is determined whether the physical memory is enabled. Such a determination may be based on data received from a locally based controller interface, such as JTAG. In particular, the JTAG or locally based controller may provide a control signal indicating whether or not the physical memory under observation is enabled for storage. If the particular memory under observation is not enabled, the method stalls at 604 until the memory is enabled. If the memory under observation is enabled, the method proceeds to 606.

At 606, it is determined whether the memory is in a Test Mode. In some embodiments, the method determines whether the memory is in a Test Mode based on data received from a locally based controller interface, such as JTAG. In particular, the JTAG or locally based controller may provide a control signal indicating whether or not the physical memory under observation is in a Test Mode. If the particular memory under observation is in a Test Mode, the method proceeds according to 608. If the particular memory under observation is not in a Test Mode, the method may stall at 606 until the memory enters a test mode. Alternatively, it may be determined that the memory under observation is in a functional mode. The determination that the memory is in a functional mode is, in some embodiments, a default determination if the memory is not in a test mode and the memory is enabled. In other embodiments, an active determination is made that the physical memory is in a functional mode. If the memory is in a functional mode, the method proceeds according to 642.

At 608, when the physical memory is in a test mode, the routing logic is adjusted for a testing mode generally. The MBIST Logic, described in the foregoing sections, will implement adjustments to the routing logic by enabling specific multiplexors for implementation and the mode or the multiplexor implementation. For example, when the physical memory is in a test mode, Routing Logic 430 is adjusted to accept an input from the MBIST 422 as opposed to the functional data 440.

At 610 it is determined whether the testing mode is the ECC mode or the Physical Memory mode. In some embodiments, the method determines whether the test mode is the ECC mode or the Physical Memory mode based on data received from a locally based controller interface, such as JTAG. In particular, the JTAG or locally based controller may provide a control signal indicating whether or not the test mode is the ECC mode or the Physical Memory mode. If the test mode is the ECC mode, the method proceeds according to 612. If the test mode is the Physical Memory mode, the method proceeds according to 614.

As part of the ECC testing mode, a test string of bits is generated in 612. The MBIST described in the foregoing may in some embodiments generate this test string of bits. Alternatively, the MBIST may retrieve a stored test string of bits or a set of stored test string bits available for this particular test. At 616, the Routing Logic is further adjusted for the ECC mode. Adjustment of the Routing Logic in accordance with 616 may occur prior to 612, synchronously with 612, or after 612. The MBIST Logic, described in the foregoing sections, will implement adjustments to the routing logic by enabling specific multiplexors for implementation and the mode or the multiplexor implementation. For example, when the test mode is the ECC mode, Routing Logic 430 is adjusted to accept an input from the MBIST 422 related to the ECC logic and Routing Logic 428 is adjusted to relay the modified data from ECC-In Register 408 provided over line 414 to line 430. The data is actually passed into the physical memory upon execution of the write operation. In some embodiments, the method determines whether a write operation is enabled based on data received from the MBIST. In some embodiments, the method determines whether a write operation is enabled based on data received from the MBIST communicatively coupled to a locally based controller interface, such as JTAG. In particular, the MBIST provides a control signal indicating whether or not the write operation is enabled. When it is determined that the write operation has been enabled (at 620), the ECC-In Register data is latched via the routing logic to the physical memory. If the write operation is not enabled, the method stalls at 620. If the write operation is enabled, the generated test string is provided to the ECC Logic in accordance with 624. The test string is then written to the physical memory and stored, which begins the test at 630. At 632, it is determined whether a read operation is executed. In some embodiments, the method determines whether a read operation is enabled based on data received from the MBIST. In some embodiments, the method determines whether a read operation is enabled based on data received from the MBIST communicatively coupled to a locally based controller interface, such as JTAG. In particular, the MBIST provides a control signal indicating whether or not the read operation is enabled. When it is determined that the read operation has been enabled (at 632), the ECC Test results are checked. In particular, at 638, the output from the ECC-Out Register is compared to the expected result. The comparison is executed by the MBIST. At 640, the test results from the comparison are conveyed, if necessary, to the tester or the manufacturer via the locally based controller interface.

As part of the Physical Memory testing mode, a test string of bits is generated in 614. As noted in the foregoing, the string of bits generated for the ECC testing mode is relatively shorter than the string of bits generated for the Physical Memory testing mode. This is due to the static bit length accepted by the physical memory and the additional check bits that must be concatenated to the test string of bits during the ECC testing mode. The MBIST described in the foregoing may in some embodiments generate this test string of bits. Alternatively, the MBIST may retrieve a stored test string of bits or a set of stored test string bits available for this particular test. At 618, the Routing Logic is further adjusted for the Physical Memory test mode. Adjustment of the Routing Logic in accordance with 618 may occur prior to 614, synchronously with 614, or after 614. The MBIST Logic, described in the foregoing sections, will implement adjustments to the routing logic by enabling specific multiplexors for implementation and the mode or the multiplexor implementation. For example, when the test mode is the Physical Memory mode, Routing Logic 430 is ignored. The data received by the Physical Memory is relayed via Routing Logic 428 from the MBIST 422. The data is actually passed into the physical memory upon execution of the write operation. In some embodiments, the method determines whether a write operation is enabled based on data received from the MBIST. In some embodiments, the method determines whether a write operation is enabled based on data received from the MBIST communicatively coupled to a locally based controller interface, such as JTAG. In particular, the MBIST provides a control signal indicating whether or not the write operation is enabled. When it is determined that the write operation has been enabled (at 622), the routing logic latches the MBIST test data string to the physical memory. If the write operation is not enabled, the method stalls at 622. If the write operation is enabled, the generated test string is provided to the physical memory in accordance with 626. The test string is then written to the physical memory and stored, which begins the test at 628. At 634, it is determined whether a read operation is executed. In some embodiments, the method determines whether a read operation is enabled based on data received from the MBIST. In some embodiments, the method determines whether a read operation is enabled based on data received from the MBIST communicatively coupled to a locally based controller interface, such as JTAG. In particular, the MBIST provides a control signal indicating whether or not the read operation is enabled. When it is determined that the read operation has been enabled (at 634), the Physical Memory test results are checked. In particular, at 636, the output from the Physical Memory is passed through the Routing Logic 428 so that it can be compared to the expected result. The comparison is executed by the MBIST. At 640, the test results from the comparison are conveyed, if necessary, to the tester or the manufacturer via the locally based controller interface.

Returning to the circumstance in which the memory is in a functional mode (642), the Routing Logic is adjusted. When in the functional mode, an on chip module will implement adjustments to the routing logic by enabling specific multiplexors. For example, when the physical memory is in a functional mode, Routing Logic 430 is adjusted to accept an input from another module on the IC and relay the data to the ECC-In Register 408. Furthermore, Routing Logic 428 is adjusted to relay the modified data from ECC-In Register 408 provided over line 414 to line 430. The data string is then passed into the physical memory upon execution of the write operation. In some embodiments, the method determines whether a write operation is enabled based on data received from the on chip module. When it is determined that the write operation has been enabled (at 644), the ECC-In Register data is latched via the routing logic to the ECC logic. If the write operation is not enabled, the method stalls at 644. If the write operation is enabled, the functional string is provided to the ECC Logic in accordance with 646. A data string, which includes the functional string plus ECC correction code, is then written to the physical memory and stored at 648. At 650, it is determined whether a read operation is executed. In some embodiments, the method determines whether a read operation is enabled based on data received the on chip module. When it is determined from 650 that the read operation has been enabled, the ECC-Out Register checks the stored data and performs any corrections necessitated by the sored error correction code. In particular, at 652, the output from the ECC-Out Register is provided to another module for further use or processing. In some embodiments, if the ECC logic cannot correct the data read from the physical memory according to the error correction code, the ECC logic sends a severe warning or error to the system that can be used to halt a sub-system or system.

Figure 7:
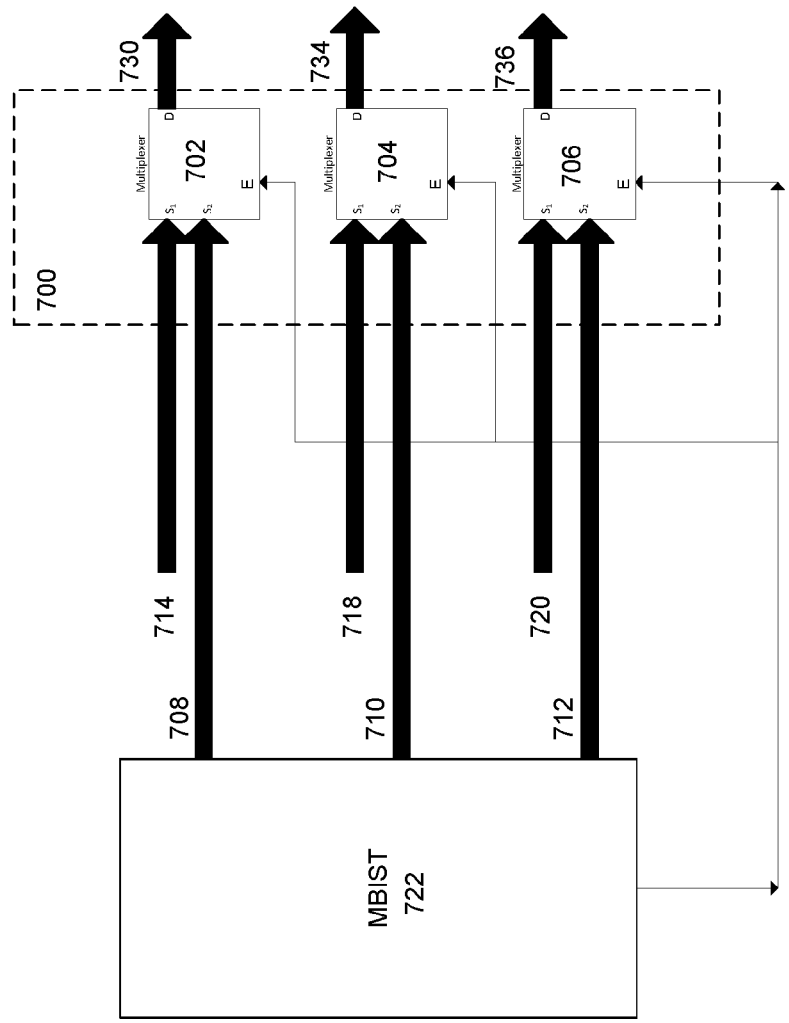
FIG. 7 illustrates the Routing Logic that is implemented in the circuits of FIG. 3 and FIG. 4 to switch between testing enabled in a physical memory mode and in an ECC mode.

FIG. 7 illustrates the Routing Logic that is implemented in the circuits of FIG. 3 and FIG. 4 to switch between testing enabled in a physical memory mode and in an ECC mode.

Routing Logic 700 includes at least three multiplexors 702, 704, and 706. The multiplexors are used to ensure that the testing is properly switchable between a physical memory mode and an ECC mode. In the physical memory mode, the MBIST 722 provides the majority of the date including but not limited to at least: the test data to be saved to the physical memory, the address data indicating at which address the test data will be saved, and the control data indicating that the physical memory is enabled, that the read/write operations are being executed, and the clocking information. Additional information may be passed through the Routing Logic with an additional mux per signal.

Mux 702 receives as input 708 and 714, and provides as output 730. Mux 702 is enabled by the MBIST 722. Input 708 relays the MBIST test data for the physical memory and Input 714 relays either the ECC-In modified test data (i.e., MBIST test data plus check-bits) or the functional data. Based on the enable provided by the MBIST 722, either the data from 708 or 714 will be routed to the output 730. When the testing mode is the physical memory mode, the mux 702 is enabled to route data from input 708 to output 730. When the testing mode is the ECC-Logic or Functional mode, the mux 702 is enabled to route data from input 714 to output 730.

Mux 704 receives as input 710 and 718, and provides as output 734. Mux 704 is enabled by the MBIST 722. Input 710 relays the MBIST provided control data for the physical memory and Input 718 relays either the control data associated with ECC-In modified test data (i.e., MBIST test data plus check-bits) or the functional data. Based on the enable provided by the MBIST 722, either the data from 710 or 718 will be routed to the output 734. When the testing mode is the physical memory mode, the mux 704 is enabled to route data from input 710 to output 734. When the testing mode is the ECC-Logic or Functional mode, the mux 704 is enabled to route data from input 718 to output 734.

Mux 706 receives as input 712 and 720, and provides as output 736. Mux 706 is enabled by the MBIST 722. Input 712 relays the MBIST provided address data and Input 720 relays either the address data associated with ECC-In modified test data (i.e., MBIST test data plus check-bits) or the functional data. Based on the enable provided by the MBIST 722, either the data from 712 or 720 will be routed to the output 736. When the testing mode is the physical memory mode, the mux 706 is enabled to route data from input 712 to output 736. When the testing mode is the ECC-Logic or Functional mode, the mux 706 is enabled to route data from input 720 to output 736.

Figure 8:
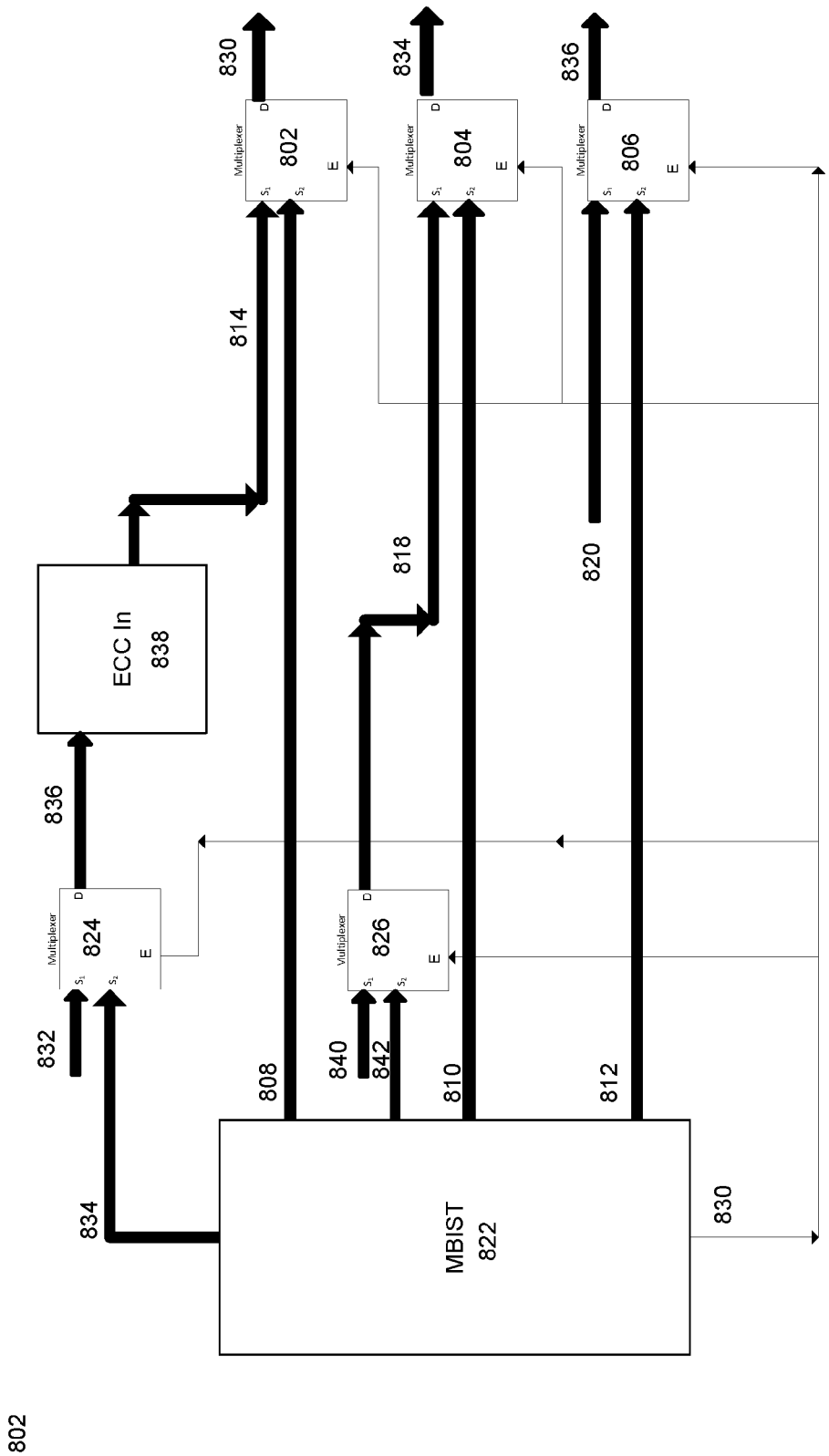
FIG. 8 illustrates additional Routing Logic that is implemented in the circuits of FIG. 3 and FIG. 4 to switch between testing enabled in a physical memory mode, testing enabled in an ECC mode, and operating in a functional mode.

FIG. 8 illustrates additional Routing Logic that is implemented in the circuits of FIG. 3 and FIG. 4 to switch between testing enabled in a physical memory mode, testing enabled in an ECC mode, and operating in a functional mode.

Routing Logic 800 includes at least two multiplexors 824 and 826. Muxes 802, 804, and 806 have a role consistent with those described in the foregoing with regard to muxes 702, 704, and 706, respectively.

Mux 824 receives as input 832 and 834, and provides as output 836. Mux 824 is enabled by the MBIST 822. Input 832 relays the functional data while the system is operational and Input 834 relays MBIST test data that is to be supplied for testing during an ECC mode. Based on the enable provided by the MBIST 822, either the data from 832 or 834 will be routed to the output 836. When the testing mode is the ECC mode, the mux 824 is enabled to route data from input 834 to output 836. When the IC is operational, the mux 824 is enabled to route data from input 832 to output 836. When the testing mode is in the physical memory mode, the output 836 is ignored. Accordingly, in some embodiments when the testing mode is the physical memory mode, the mux 824 is disabled. In other embodiments when the testing mode is the physical memory mode, the mux 824 enabled by the MBIST 822 is in a "don't care" mode.

Mux 826 receives as input 840 and 842, and provides as output 818. Mux 826 is enabled by the MBIST 822. Input 840 relays the control data associated with the functional data while the system is operational and Input 842 relays control data associated with MBIST test data that is to be supplied for testing during an ECC mode. Based on the enable provided by the MBIST 822, either the data from 840 or 842 will be routed to the output 818. When the testing mode is the ECC mode, the mux 826 is enabled to route data from input 842 to output 818. When the IC is operational, the mux 826 is enabled to route data from input 840 to output 818. When the testing mode is in the physical memory mode, the output 818 is ignored. Accordingly, in some embodiments when the testing mode is the physical memory mode, the mux 826 is disabled. In other embodiments when the testing mode is the physical memory mode, the mux 826 enabled by the MBIST 822 is in a "don't care" mode.

In the foregoing Description of Exemplary Embodiments, various features are grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Exemplary Embodiments, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. Thus, it is intended that the specification and examples be considered as exemplary only, with a true scope of the present disclosure being indicated by the following claims and their equivalents.

What is claimed is:

1. A method for testing a memory component of an integrated circuit, the memory component including a physical memory and an error correction logic, the method comprising:
   receiving, from an interface controller, a test instruction at a built-in design for test processing device;
   wherein, based on the received test instruction:
      selectively connecting, with routing logic associated with the built-in design for test processing device, the built-in design for test processing device to: (i) only the physical memory in a first mode and (ii) the error correcting code logic in a second mode;
      retrieving, from the memory component, an original data string associated with one of the first mode and the second mode;
      generating a test string for testing based on the retrieved original data string, wherein, in the second mode, the generated test string includes an error correction code;
      storing, in the memory component, the generated test string;
      checking the stored generated test string by comparing an output of the generated test string from the memory component to an expected result of the original data string, wherein the output of the generated test string is output, via other routing logic, to (i) the built-in design for test processing device during the first mode and (ii) an electronic correcting code register during the second mode; and
      selectively correcting, with one of the built-in design for test processing device and the electronic correcting code register, the generated test string based on the checking.

2. The method of claim 1, wherein the test instruction initiates a test of only the physical memory.

3. The method of claim 1, wherein the test instruction initiates a test of the error correction logic.

4. The method of claim 1, wherein, when the test instruction initiates a test of only the physical memory:
   the generated test string is a first test string for application to the physical memory,
   the first test string is stored in the physical memory,
   a first output string is read from the physical memory, and
   the first output string is compared to a first expected string.

5. The method of claim 4, further comprising: determining based on a comparison of the first output string to the first expected string whether the test of only the physical memory resulted in a fault.

6. The method of claim 1, wherein, when the test instruction initiates a test of the error correction logic:
   the generated test string is a second test string for application to the error correction logic,
   a modified version of the second test string includes the error correction code and is stored in the physical memory,
   a second output string is read from the physical memory,
   the read second output string is re-applied to the error correction logic, and
   a third output string from the error correction logic that is based on the read second output string is compared to a second expected string.

7. The method of claim 6, further comprising: determining based on a comparison of the third output string to the second expected string whether the test of the error correction logic resulted in a fault.

8. The method of claim 1, wherein the routing logic is switched to a first set of connections when the test instruction initiates a test of only the physical memory and a second set of connections when the test instruction initiates a test of the error correction logic.

9. The method of claim 1, wherein the routing logic remains unaltered when the test instruction indicates that there is no test and that the integrated circuit is operating in a functional mode.

10. The method of claim 1, further comprising:
    determining whether a test according to the test instruction found a fault, and
    transmitting, to the interface controller, an output signal including a warning if the fault was determined.

11. A test circuit that checks memory on a manufactured integrated circuit according to at least two testing modes, the test circuit comprising:
    an error correcting code logic portion of the memory;
    a physical memory portion of the memory;
    a built-in design for test processing device;
    an interface controller configured to receive an input; and
    routing logic;
    wherein, based on the input from the interface controller:
       the routing logic is configured to selectively connect the built-in design for test processing device to: (i) only the physical memory portion in a first mode and (ii) the error correcting code logic portion in a second mode;
       the memory is configured to retrieve an original data string associated with one of the first mode and the second mode;
       the built-in design for test processing device is configured to generate a test string for testing based on the retrieved original data string, wherein the generated test string is (i) stored in the memory and (ii) checked by comparing an output of the generated test string from the memory to an expected result of the original data string, wherein the output of the generated test string is output, via other routing logic, to (i) the built-in design for test processing device during the first mode and (ii) an electronic correcting code register during the second mode, wherein, in the second mode, the generated test string includes an error correction code; and
       one of the built-in design for test processing device and the electronic correcting code register corrects the generated test string based on the checking.

12. The test circuit of claim 11, wherein the routing logic includes at least one multiplexor.

13. The test circuit of claim 12, wherein the at least one multiplexor is enabled by the built-in design for test processing device.

14. The test circuit of claim 11, wherein in the first mode, the built-in design for test processing device generates a first test string for testing the physical memory, and in the second mode, the built-in design for test processing device generates a second test string for testing the error correcting code logic portion.

15. The test circuit of claim 14, wherein the routing logic is configured, first, according to the first mode and facilitates a test of the physical memory using the first test string, and then following the test of the physical memory, is configured according to the second mode and facilitates a test of the error correcting code logic portion.

16. The test circuit of claim 13, wherein the routing logic is configured so that at least two multiplexors are cascaded.

17. The test circuit of claim 14, wherein in the first mode:
the first test string is stored in the physical memory,
a first output string is read from the physical memory, and
the first output string is compared to a first expected string.

18. The test circuit of claim 14, wherein in the second mode:
the second test string includes the error correction code and is stored in the physical memory,
a second output string is read from the physical memory,
the read second output string is re-applied to the error correction logic, and
a third output string from the error correction logic that is based on the read second output string is compared to a second expected string.

19. The test circuit of claim 17, wherein the built-in design for test processing device is configured to generate a comparison result and provide an output signal including a warning if a fault was determined based on the comparison result.

20. The test circuit of claim 18, wherein the built-in design for test processing device is configured to generate a comparison result and provide an output signal including a warning if a fault was determined based on the comparison result.

* * * * *